United States Patent
Ramamurthy et al.

[19]

[11] Patent Number: 5,781,038
[45] Date of Patent: *Jul. 14, 1998

[54] HIGH SPEED PHASE LOCKED LOOP TEST METHOD AND MEANS

[75] Inventors: Krishnan Ramamurthy, Santa Clara, Calif.; Rong Pan, Aberdeen, N.J.; Ross MacTaggart, Eden Prarie, Minn.; Francois Ducaroir, Santa Clara, Calif.

[73] Assignee: LSI Logic Corporation

[*] Notice: This patent issued on a continued prosecution application filed under 37 CFR 1.53(d), and is subject to the twenty year patent term provisions of 35 U.S.C. 154(a)(2).

[21] Appl. No.: 597,896

[22] Filed: Feb. 5, 1996

[51] Int. Cl.⁶ .................................................. H03K 5/22
[52] U.S. Cl. .................. 327/23; 327/20; 327/22; 327/27; 327/159; 331/DIG. 2
[58] Field of Search ............................ 327/18, 20, 22, 327/23, 27, 156, 159; 331/DIG. 2

[56] References Cited

U.S. PATENT DOCUMENTS

| | | | |
|---|---|---|---|
| 4,048,445 | 9/1977 | Ghisler . | |
| 4,071,887 | 1/1978 | Daly et al. | 364/200 |
| 4,271,513 | 6/1981 | Maejima et al. | 371/22 |
| 4,308,472 | 12/1981 | McLaughlin | 327/18 |
| 4,419,633 | 12/1983 | Phillips | 331/DIG. 2 |
| 4,486,739 | 12/1984 | Franaszek et al. | 340/347 |
| 4,564,933 | 1/1986 | Hirst | 370/15 |
| 4,573,017 | 2/1986 | Levine | 327/114 |
| 4,575,841 | 3/1986 | Fagerstedt et al. | 370/14 |
| 4,631,719 | 12/1986 | Huffman et al. | 370/15 |
| 4,675,886 | 6/1987 | Surie . | |
| 4,748,623 | 5/1988 | Fujimoto . | |
| 4,751,469 | 6/1988 | Nakagawa et al. | 327/23 |
| 4,806,878 | 2/1989 | Cowley | 331/DIG. 2 |
| 4,908,819 | 3/1990 | Casady et al. | 370/15 |
| 4,920,546 | 4/1990 | Iguchi et al. . | |
| 4,975,916 | 12/1990 | Miracle et al. | 371/47.1 |
| 4,979,185 | 12/1990 | Bryans et al. | 375/20 |
| 4,988,901 | 1/1991 | Kamuro et al. | 327/18 |
| 5,010,559 | 4/1991 | O'Connor et al. | 375/116 |
| 5,025,458 | 6/1991 | Casper et al. | 375/114 |
| 5,028,813 | 7/1991 | Hauck et al. | 327/18 |
| 5,040,195 | 8/1991 | Kosaka et al. | 375/114 |
| 5,043,931 | 8/1991 | Kovach et al. | 364/579 |
| 5,052,026 | 9/1991 | Walley | 375/119 |
| 5,111,451 | 5/1992 | Piasecki et al. | 370/29 |
| 5,126,690 | 6/1992 | Bui et al. | 331/DIG. 2 |
| 5,159,279 | 10/1992 | Shenoi et al. | 327/23 |
| 5,180,993 | 1/1993 | Dent | 331/DIG. 2 |
| 5,251,217 | 10/1993 | Travers et al. | 370/112 |
| 5,265,089 | 11/1993 | Vonehara | 370/15 |
| 5,268,652 | 12/1993 | Lafon | 331/DIG. 2 |
| 5,274,668 | 12/1993 | Marschall | 375/10 |
| 5,299,236 | 3/1994 | Pandula | 375/116 |
| 5,327,103 | 7/1994 | Baron et al. | 331/DIG. 2 |
| 5,337,306 | 8/1994 | Hall | 370/13 |
| 5,343,461 | 8/1994 | Barton et al. | 370/13 |
| 5,353,250 | 10/1994 | McAdams | 365/189 |
| 5,379,409 | 1/1995 | Ishikawa . | |
| 5,398,270 | 3/1995 | Cho et al. | 327/23 |
| 5,448,571 | 9/1995 | Hong et al. | 370/105 |
| 5,473,758 | 12/1995 | Allen et al. | 395/430 |
| 5,481,543 | 1/1996 | Veltman | 370/112 |
| 5,559,854 | 9/1996 | Suzuki . | |
| 5,577,039 | 11/1996 | Won et al. | 370/112 |

*Primary Examiner*—Terry Cunningham
*Attorney, Agent, or Firm*—Kevin L. Daffer; Conley, Rose & Tayon

[57] ABSTRACT

A means and method for testing high speed phase locked loops (13) in an integrated circuit (12) at a test frequency lower than the operation speed of the phase locked loop (13). A test circuit portion (10) repeatedly tests for a zero level (42) of a recover clock signal (34) from the phase locked loop (13) and a latching flip flop (26) is set to provide a lock indication output (30) as long as repeated samples, taken at a test time (38) continue to indicate a zero level (42) of the recover clock signal (34). The test time (38) is the leading edge (40) of a reference clock signal (36) provided from an external source at a reference clock input (28) to the integrated circuit (12).

12 Claims, 2 Drawing Sheets

HIGH SPEED PHASE LOCKED LOOP TEST METHOD AND MEANS

DESCRIPTION

1. Technical Field:

The present invention relates to the field of integrated electronic circuit manufacturing and testing, and more particularly to a means and method for testing high speed integrated circuits containing phase locked loops ("PLLs"). The predominant current usage of the present inventive high speed phase locked loop test will be in testing of high speed asynchronous communication integrated circuits on a low speed wafer-probe tester.

2. Background Art:

It is necessary to test integrated circuits at the end of the manufacturing process and also, in many instances, at various stages in the manufacturing process. In the past, the testing of circuits containing PLLs has required the use of expensive high speed testers. Additionally, as the speed of operation of asynchronous data transfer circuits and therefore, of the PLLs therein, has increased, the cost and difficulty of testing the PLLs at their native speed has become much greater.

While it would seem to be advantageous to find a way to test high speed PLLs without the costs associated with very high speed testing apparatus, this has appeared to be an unattainable goal, since testing the PLLs at other than their normal operating speeds would provide a less than accurate test, even if this sort of testing were possible—which it would not be in many instances.

To the inventors' knowledge, no prior art system for testing the PLLs in a high speed integrated circuit has existed in the prior art which system did not require the use of a high speed tester. Furthermore, as the speed of operation of such integrated circuits is increasing, such prior art tests are becoming less than satisfactory for reliability reasons, quite apart from the aforementioned problems relating to the expense of the equipment required for such testing

DISCLOSURE OF INVENTION:

Accordingly, it is an object of the present invention to provide a method and means for testing PLLs in an integrated circuit which method and means is appropriate and accurate when applied to very high speed PLLS.

It is another object of the present invention to provide an improved method for testing PLLs in an integrated circuit which can be accomplished using inexpensive low speed external testers.

It is yet another object of the present invention to provide an improved method for testing PLLs in an integrated circuit which can be rapidly accomplished so as to minimize on line testing time during the production of the circuit.

It is still another object of the present invention to provide an improved method for testing PLLs in an integrated circuit which method is inexpensive to implement in terms of labor, additional chip layout cost, and any and all other variables.

It is yet another object of the present invention to provide a method for quickly and accurately testing the PLLs in a high speed asynchronous communications circuit.

Briefly, the preferred embodiment of the present invention is a modified circuit portion within the asynchronous data communications integrated circuit which is to be produced and tested according to the present inventive method. The circuit modification provides for frequency division of the output of the PLLs such that an accurate indication of the locked condition of the PLLs can be had by comparing the divided signal to a signal from a relatively low speed external test apparatus.

An advantage of the present invention is that readily available and inexpensive external testing devices can be used to test very high speed PLLs.

A further advantage of the present invention is that potential inaccuracies which might be introduced through the transfer of high frequency signals between the integrated circuit under test and the external test equipment are reduced or eliminated.

Yet another advantage of the present invention is that minimal modification to the integrated circuit layout is required such that additional layout or production expense is negligible and, further, such that very little precious real estate on the chip is required for implementation.

Still another advantage of the present invention is that the test can be quickly accomplished such that it will not provide a bottle neck in the production process and, further, such that it can be performed at any of several potential junctures in the manufacturing process - or at more than one such juncture should that prove to be desirable.

Yet another advantage of the present invention is that time and labor costs associated with production line testing are minimized.

Still another advantage of the present invention is that costs associated with producing defective parts are reduced.

These and other objects and advantages of the present invention will become clear to those skilled in the art in view of the description of the best presently known mode of carrying out the invention and the industrial applicability of the preferred embodiment as described herein and as illustrated in the several figures of the drawing.

BEST MODE FOR CARRYING OUT THE INVENTION:

The following detailed description illustrates the invention by way of example, not by way of limitation of the principles of the invention. The best presently known mode for carrying out the invention is a modified circuit portion within a core for constructing a custom or semi-custom integrated circuit for high speed asynchronous data communications.

Figure 1:
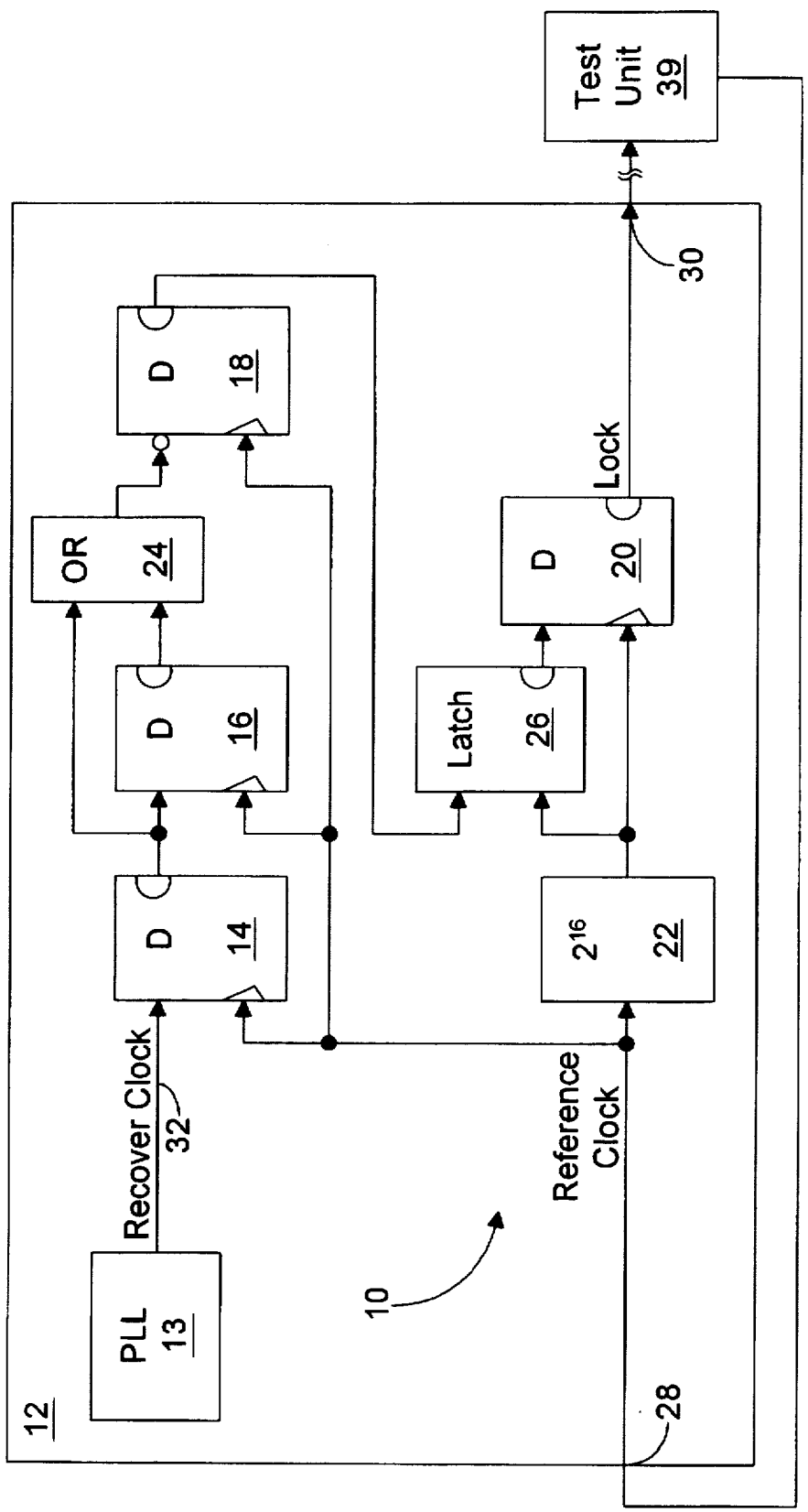
FIG. 1 is a block schematic diagram of a test circuit portion according to the present invention.

The inventive test circuit portion is depicted in a perspective view in FIG. 1 and is designated therein by the general reference character 10. As can be seen in the view of FIG. 1, the test circuit portion 10 is on an integrated circuit 12. It should be noted that, in an actual integrated circuit 12, the test circuit portion 10 will occupy only a very small portion of the space ("real estate") available on the integrated circuit. It should further be noted that, in actual practice, the test circuit portion 10 will generally be part of a "core" which is, itself, a subcomponent of the entire integrated circuit 12. However, since this distinction is not pertinent to the present invention, this further division of the integrated circuit 12 is not depicted in the view of FIG. 1. A phase locked loop 13 is depicted in block form in the view of FIG. 1. The phase locked loop 13 is that portion of the integrated circuit 12 which is to be tested according to present inventive method and means.

The test circuit portion 10 of the integrated circuit 12 has a first flip flop 14, a second flip flop 16, a third flip flop 18 and a fourth flip flop 20. The four flip flops 14, 16, 18 and 20 are "OD" type flip flops, with the third flip flop 18 being an inverting variety, as is depicted in the view of FIG. 1. A logical or 24 and a latch 26 (latching flip flop) are also depicted in block form in the view of FIG. 1. A reference clock input 28 and a lock indication output 30 are provided on the perimeter of the integrated circuit 12 for connection to external test equipment 39 and/or for connection to normal operation mode equipment, should such connections be required. A recover clock signal line 32 connects the phase locked loop 13 to the test circuit portion 10.

Figure 2:
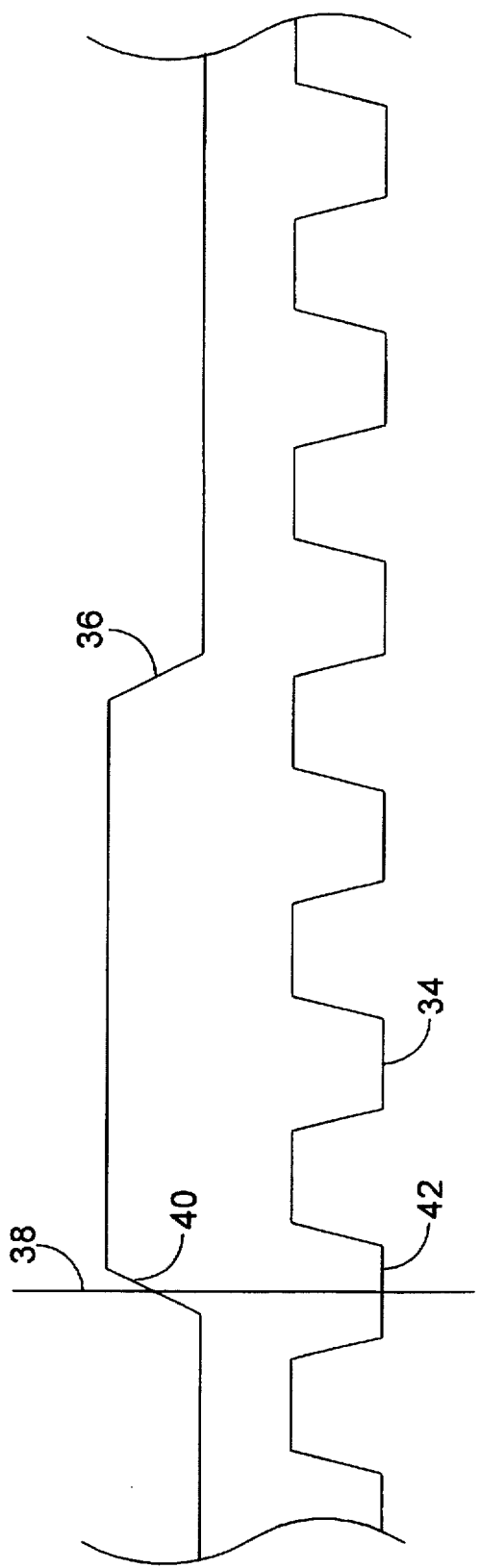
FIG. 2 is a timing diagram showing signals relevant to the operation of the present inventive method and means.

FIG. 2 depicts waveforms relevant to the operation of the circuitry depicted in FIG. 1. A recover clock signal 34 is an example of the signal which would be present on the recover clock signal line 32 of FIG. 1. The reference clock signal 36 is typical of an external clock signal which would be introduced to the integrated circuit 1'2 through the reference clock input 28 of FIG. 1. As will be discussed in greater detail hereinafter, a test time 38 corresponds to a leading edge 40 of the reference clock signal 36. One skilled in the art will recognize that a zero level 42 is indicated by lower portions of the recover clock signal 34.

Referring to the block circuit diagram of FIG. 1, the first flip flop 14 and the second flip flop 16 are both triggered at the leading edge 40 of the reference clock signal 36 (FIG. 2) to sample the instantaneous condition of the recover clock signal 34 on the recover clock signal line 32 (FIG. 1). The outputs of the first flip flop 14 and the second flip flop 16 are provided to the logical or 24, and the output of the logical or 24 is provided to the input of the third flip flop 18. In the present example, a locked condition of the phase locked loop 13 will be indicated by a repeated zero level 42 of the recover clock signal 34 at the test time 38, although it would be within the scope of the invention to test for a 1 level instead of the zero level 42 of the present example. The test time 38 is the trigger time of the first flip flop 14 and the second flip flop 16 which, as just indicated, will be on the leading edge 40 of the reference clock signal 36.

If the recover clock signal 34 is at zero level 42 at the test time 38, then the output of the inverting third flip flop 18 will be a one when the third flip flop 18 is triggered by the reference clock 36 provided at the reference clock input 28. The latch 26 has inputs from the third flip flop 18 and from the sixteen bit counter 22. The latch 26 will be triggered by the sixteen bit counter 22 every sixty four thousand cycles of the reference clock signal 36 to produce a latched high or low output. If the recover clock signal 34 is at zero level 42, then there will be a high output from the third flip flop 18, and the latch 26 will provide a high output to the fourth flip flop 20 such that a high output will be provided to the lock indication output 30 indicating a locked condition of the phase locked loop 13. Should, at any time, the latch 26 become latched low, as would occur if a non-zero level from the recover clock signal 34 was sampled at the test time 38, then a low output would be provided at the lock indication output 30, indicating an unlocked condition.

Industrial Applicability:

The inventive test circuit portion 10 and associated method are intended to be widely used for inclusion in high speed digital circuit having phase locked loops. It is anticipated that the inventive test will typically be conducted during the wafer sort portion of the manufacturing process, which will greatly enhance the manufacturing process and the yield and reliability of the finished product.

The inventors have found that, using the inventive method and means described herein, a PLL running at 106 MHZ can be check for lock condition using a 1 MHz tester. Since the inventive test circuit portions may be readily produced and integrated into existing designs for integrated circuits and cores which include high speed PLLS, and since the inventive test method is readily integrated into in-process test procedures during the manufacture of integrated circuits, and further since the advantages as described herein are provided, it is expected that the invention will be readily accepted into in the industry. For these and other reasons, it is expected that the utility and industrial applicability of the invention will be both significant into in scope and long lasting into in duration.

All of the above are only some of the examples of available embodiments of the present invention. Those skilled into in the art will readily observe that numerous other modifications and alterations may be made without departing from the spirit and scope of the invention. Accordingly, the above disclosure is not intended as limiting and the appended claims are to be interpreted as encompassing the entire scope of the invention.

It should be understood that various modifications within the scope of this invention can be made by one of ordinary skill in the art without departing from the spirit thereof. We therefore wish our invention to be defined by the scope of the appended claims as broadly as the prior art will permit, and in view of the specification if need be.

We claim:

1. A method for testing a phase locked loop (PLL) circuit, comprising:

dispatching output from the PLL into a first flip-flop having an output coupled to an input of a second flip-flop, and wherein the output from the first and second flip-flops are forwarded to an OR gate whose output is coupled to an inverting input of a third flip-flop;

comparing transitions of the output from the PLL with transitions of a clocking signal by clocking the first, second and third flip-flops by the clocking signal;

selecting a count cycle from among numerous cycles of said clocking signal; and providing a signal indicating a locked condition of the PLL circuit from a latch to which output from the third flip-flop is forwarded, wherein the locked indication signal occurs during the count cycle if transitions of the output from the PLL are synchronized with transitions of the clocking signal as indicated by the comparing step.

2. The method as recited in claim 1, further comprising providing said clocking signal at a slower frequency than the output from the PLL circuit during times when the PLL circuit is in an unlocked condition.

3. The method as recited in claim 1, wherein said selecting comprises counting one cycle from among $2^{16}$ cycles within said clocking signal.

4. The method as recited in claim 1, wherein said selecting comprises dispatching said count cycle from a counter subsequent to transitions within the output from the third flip-flop to ensure said count cycle occurs concurrent with the steady state value.

5. The method as recited in claim 1, wherein said latching comprises forwarding, as an output from an integrated circuit embodying the PLL circuit, the output from the third flip-flop coincident with the count cycle for one half duration of said count cycle.

6. The method as recited in claim 5, wherein said output is adapted for insertion into test equipment distally located from the integrated circuit.

7. The method as recited in claim 6, wherein said clocking signal is provided from the test equipment.

8. An integrated circuit, comprising:

a phase locked loop (PLL) circuit adapted for producing a PLL output comprising (i) a transitional output during times when the PLL circuit is in an unlocked condition, and (ii) a steady state output during times when the PLL circuit is in a locked condition;

a test circuit portion configured to receive the PLL output and a reference clock from a test unit adapted to operably couple to the integrated circuit external from the integrated circuit, said test circuit portion comprising:

a first flip-flop having an output coupled to an input of a second flip-flop, each of which is clocked by the reference clock;

an OR gate coupled to receive output from the first and second flip-flops, and further coupled to provide inverted input to a third flip-flop;

a counter coupled to receive the reference clock and select a count value from among a series of periodic cycles of the reference clock; and a latch coupled to receive output from the third flip-flop and the count value for latching a voltage value output from the third flip-flop during the count cycle, wherein the latched voltage value is at a pre-defined voltage value if the PLL output is at a steady state output during a time in which the count value occurs.

9. The integrated circuit as recited in claim 8, wherein said test unit is adapted to receive the pre-defined voltage value.

10. The integrated circuit as recited in claim 9, wherein said reference clock produced from the test unit and the latched voltage value occur at frequencies less than the PLL output frequency for ease by which the test unit can respectively produce and detect the reference clock and the latched voltage value.

11. The integrated circuit as recited in claim 8, wherein said pre-defined voltage value consists of a logic high value if the PLL output is at a steady state output indicative of a locked condition during the time at which the count value occurs.

12. An integrated circuit, comprising:

a first flip-flop coupled to receive a PLL output;

a second flip-flop coupled to receive output from the first flip-flop;

a reference clock coupled to clock the first and second flip-flops, wherein the first and second flip-flops compare transitions of the PLL output with transitions of the reference clock, and wherein the first and second flip-flops forward a logic low value from both the first and second latches to an OR gate if logic low values of the PLL output are synchronized with transitions of the clocking signal;

a third flip-flop coupled to produce a logic high value upon receiving the reference clock and an inverted output from the OR gate;

a counter coupled to receive the reference clock and select a count cycle from among a series of periodic cycles of the reference clock; and a latch coupled to receive output from the third flip-flop and the count cycle, and to dispatch a signal indicating the PLL output is in a locked condition if the logic high value output from the third latch remains during the count cycle indicative of the PLL output being synchronized with transitions of the clocking cycle.

\* \* \* \* \*